United States Patent [19]
Iwakiri

[11] Patent Number: 5,930,186
[45] Date of Patent: Jul. 27, 1999

[54] METHOD AND APPARATUS FOR TESTING COUNTER AND SERIAL ACCESS MEMORY

[75] Inventor: Itsuro Iwakiri, Miyazaki, Japan

[73] Assignee: Oki Electric Industry Co., Ltd., Tokyo, Japan

[21] Appl. No.: 08/959,443

[22] Filed: Oct. 28, 1997

[30] Foreign Application Priority Data

Oct. 31, 1996 [JP] Japan ................................. H08-289463

[51] Int. Cl.[6] ........................................................ G11C 7/00
[52] U.S. Cl. .............................. 365/201; 365/221; 365/239
[58] Field of Search .................................... 365/201, 233, 365/221, 239

[56] References Cited

U.S. PATENT DOCUMENTS

| | | | |
|---|---|---|---|
| 4,336,448 | 6/1982 | Shipp et al. ............................. | 377/29 |
| 4,661,930 | 4/1987 | Tran ......................................... | 365/201 |
| 4,991,185 | 2/1991 | Hatten et al. ............................. | 377/29 |
| 5,412,580 | 5/1995 | Fulcomer et al. ..................... | 371/22.5 |
| 5,430,688 | 7/1995 | Takasugi .................................. | 365/201 |
| 5,473,651 | 12/1995 | Guzinski et al. ......................... | 377/29 |

*Primary Examiner*—Vu A. Le
*Attorney, Agent, or Firm*—Rabin & Champagne, P.C.

[57] ABSTRACT

In a method for testing a counter, the counter is first set at a predetermined initial value. Then, the counter is incremented in response to the clocks. The number of the clocks is counted until a carry is outputted from the counter to provide an actual counted value. The actual counted value is compared to a reference value, which is calculated in advance. And then, the counter is decided whether to be operating normally or not on the basis of the result of the comparison.

5 Claims, 6 Drawing Sheets

METHOD AND APPARATUS FOR TESTING
COUNTER AND SERIAL ACCESS MEMORY

CROSS REFERENCE TO RELATED APPLICATION

This application claims the priority of Application No. H08-289463, filed Oct. 31, 1996 in Japan, the subject matter of which is incorporated herein by reference.

TECHNICAL FIELD OF THE INVENTION

The present invention relates to a method and an apparatus for testing a counter, used for a serial access memory, and to a serial access memory itself.

BACKGROUND OF THE INVENTION

In general, a serial access memory is a kind of computer memory in which data are available only in the same sequence as originally stored. The serial access memory includes an address counter, which generally increments an initial memory address as a block of data is being transferred into the memory locations indicated by the counter. Conventionally, a test of the address counter has been performed using a read-modify-write scheme to find degeneration of memory cells. In the test, predetermined data are written in every memory cell, then different data are rewritten in the same address of the memory cell. For example, data of "0" are written in every memory cell while incrementing the address counter, then the address counter is reset to "0", and then data of "1" are rewritten in the same address of the memory cell while incrementing the address counter.

In this case, if the address counter is not incremented in order when the data are read for rewriting, some memory cells store data "1" and the other memory cells store data "0." The data in the memory cells are again read in the same sequence as the rewriting. If all the read data are "1," the address counter is decided to be operating normally; however, if some data of "0" are included in the read data, the address counter is decided not to be operating normally and some addresses are degenerated. A serial access memory containing an address counter with degenerated addresses is rejected as a defective product.

Recently, such a serial access memory is becoming increasingly to have a large capacity, and therefore, it takes long time to perform the read/write test for each memory cell. As a result, it becomes difficult to improve productivity of the serial access memory. In addition, when the serial access memory is decide to be defective, it can not be known whether the problem is on the address counter or on other devices in the memory.

OBJECTS OF THE INVENTION

Accordingly, an object of the invention is to provide a method for testing a counter, by which the counter can be tested easily and accurately in a short time.

Another object of the invention is to provide an apparatus for testing a counter, which tests the counter easily and accurately in a short time.

Another object of the invention is to provide a serial access memory in which an address counter can be tested easily and accurately in a short time without performing a read/write process to a memory array.

Still another object of the invention is to provide a combination of a serial access memory and a tester, in which an address counter can be tested easily and accurately in a short time without performing a read/write process to a memory array.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the invention, in a method for testing a counter, which operates in synchronism with clocks, the counter is first set at a predetermined initial value. Then, the counter is incremented in response to the clocks. The number of the clocks is counted until a carry is outputted from the counter to provide an actual counted value. The actual counted value is compared to a reference value, which is calculated in advance. And then, the counter is decided whether to be operating normally or not on the basis of the result of the comparison. The reference value is obtained by previously calculating the number of the clocks to be provided from the initial value until the carry is outputted from the counter.

According to a second aspect of the invention, an apparatus for testing a counter, which is incremented in response to clocks and outputs a carry when the counter is overflowed, includes a reset circuit which resets the counter at a predetermined initial value. The apparatus further includes a counter circuit which counts, in response to the clocks, the number of the clocks until the carry is outputted from the counter to provide an actual counted value. The apparatus is provided with a comparator which compares the actual counted value to a reference value, which is calculated in advance. The counter is decided, on the basis of the result of the comparison, whether to be operating normally or not.

According to a third aspect of the invention, a serial access memory, which operates in synchronism with clocks, includes a memory array which stores predetermined data, and an address counter which is incremented in response to the clocks and outputs a carry when it is overflowed. The serial access memory further includes an output circuit which selectively outputs the data supplied from the memory array and the carry supplied from the address counter. The output circuit selects the data when a test of the address counter is not performed and selects the carry when the test of the address counter is performed. The serial access memory may be provided with an address register which presets the address counter to a desirable initial value.

According to a fourth aspect of the invention, the serial access memory of the third aspect of the invention and the apparatus of the second aspect of the invention are combined.

DETAILED DISCLOSURE OF THE INVENTION

Figure 1:
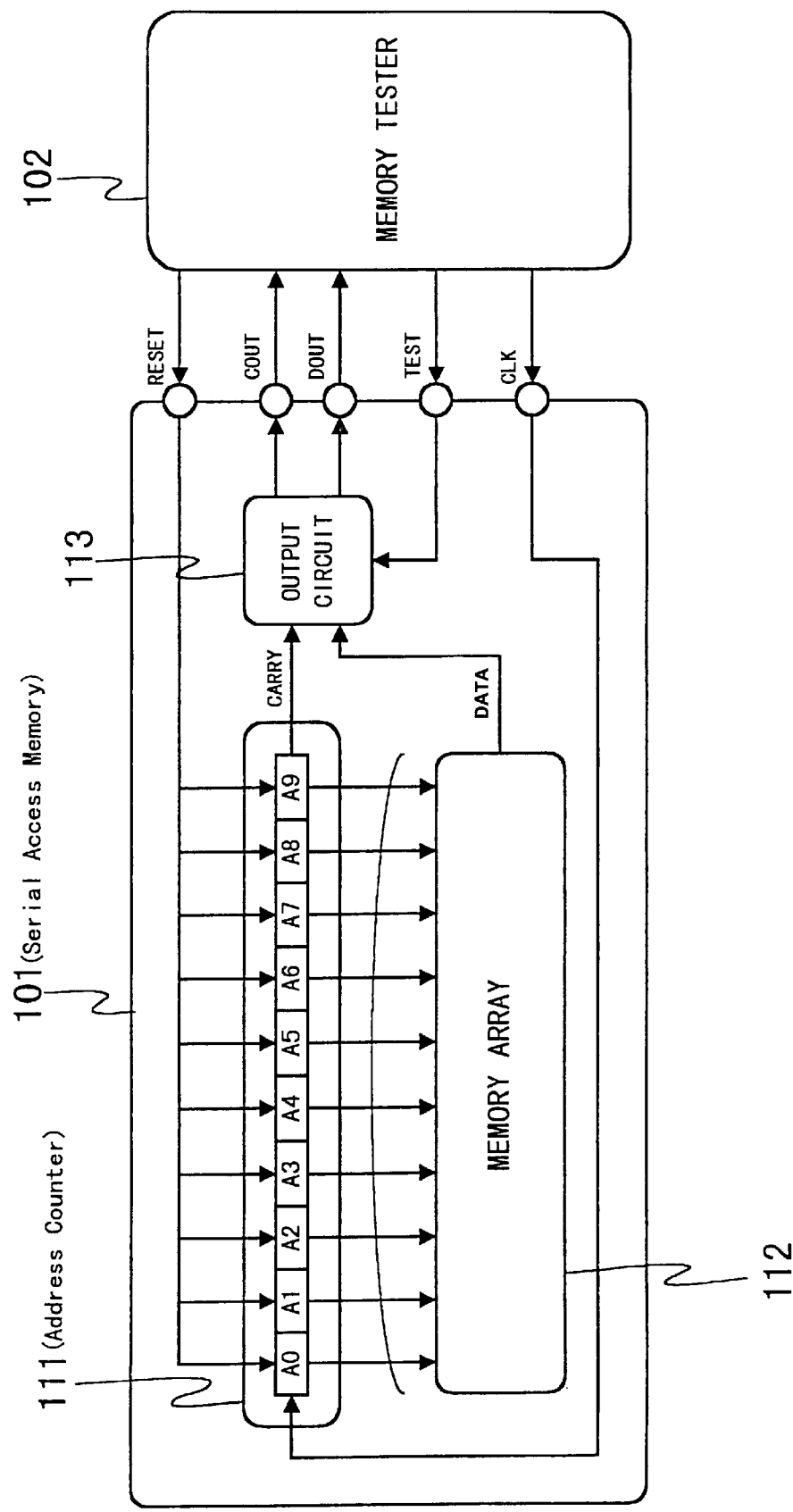
FIG. 1 is a block diagram showing a serial access memory and a memory tester, according to a first preferred embodiment of the invention.

FIG. 1 shows a serial access memory 101 and a memory tester 102, according to a first preferred embodiment of the invention. The serial access memory 101 includes an address counter 111, a memory array 112 and an output circuit 113. The serial access memory 101 further includes a reset terminal RESET, a carry out terminal COUT, a data out terminal DOUT, a test terminal TEST and a clock terminal CLK. The reset terminal RESET is connected to the memory tester 102 and the address counter 111. Each of the carry out terminal COUT and data out terminal DOUT is connected to the memory tester 102 and the output circuit 113. The test terminal TEST is connected to the memory tester 102 and the output circuit 113. The clock terminal CLK is connected to the memory tester 102 and the address counter 111. The output circuit 113 is connected to the address counter 111 and the memory array 112.

The memory array 112 supplies data to the output circuit 113. The address counter 111 addresses the memory array 112 when performing a reading process and a writing process. The address counter 111 is of 10-bit type, which is incremented from zero value in synchronization with clocks, supplied from the clock terminal CLK. The address counter 111 outputs a carry signal CARRY in response to $1024^{th}$ clock (CLK).

In response to a test signal supplied through the test terminal TEST from the memory tester 102, the output circuit 113 selects, one from two output signals of the carry (CARRY), supplied from the address counter 111, and data (DATA), supplied from the memory array 112. In more detail, for example, the test terminal TEST is set at low when the address counter 111 is to be tested, and the carry signal CARRY outputted from the address counter 111 is supplied from the carry out terminal (COUT) to the memory tester 102. On the other hand, the test terminal TEST is set at high when the address counter 111 is not tested, and the data (DATA) outputted from the memory array 112 are supplied from the data out terminal DOUT to the memory tester 102.

Figure 2:
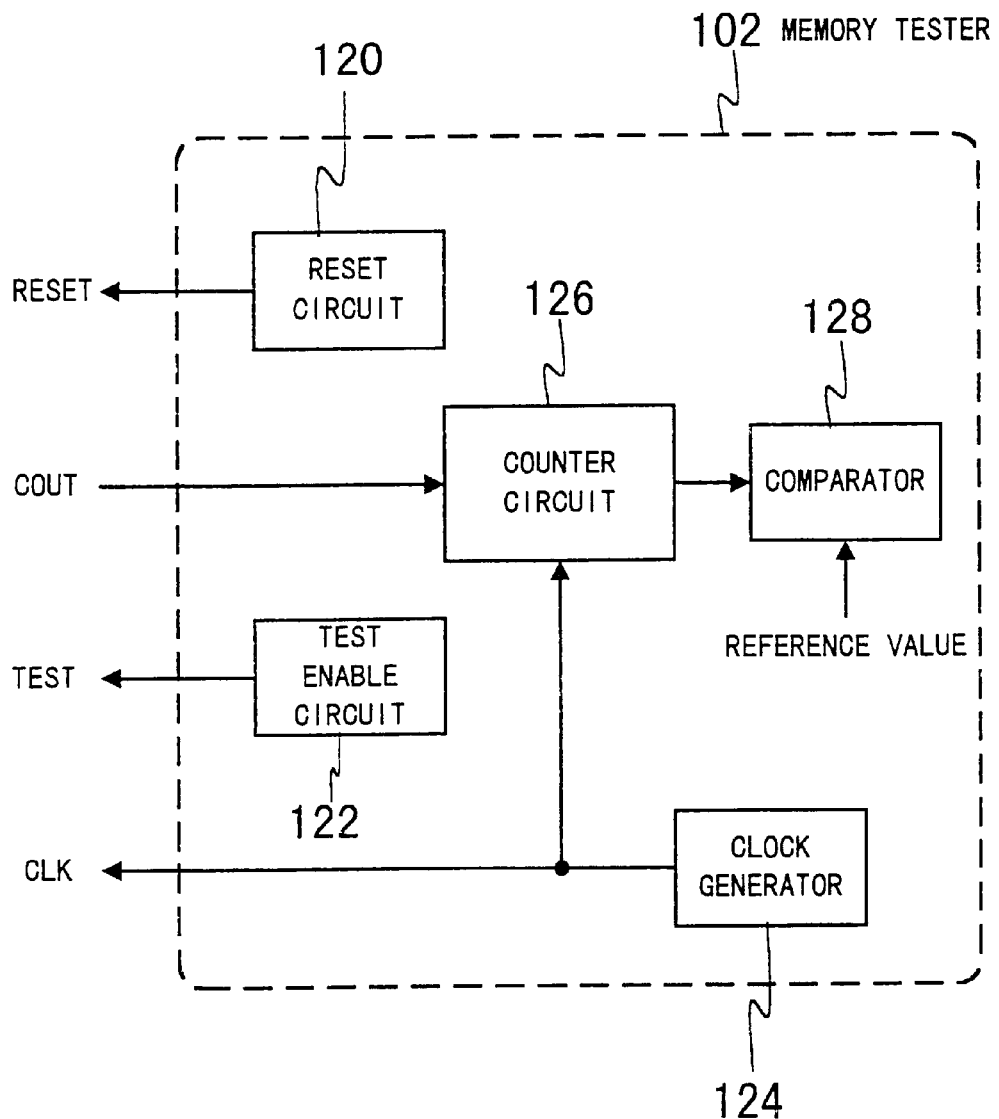
FIG. 2 is a block diagram showing the memory tester.

FIG. 2 shows the structure of the memory tester 102, which includes a reset circuit 120, a test enable circuit 122, a clock generator 124, a counter circuit 126 and a comparator 128. The reset circuit 120 is connected to the reset terminal RESET of the serial access memory 101 to supply a reset signal thereto. The test enable circuit 122 is connected to the test terminal TEST of the serial access memory 101 to supply a test enable signal thereto. The clock generator 124 is connected to the clock terminal CLK of the serial access memory 101 and the counter circuit 126, so that clock signals are supplied to both of them. The counter circuit 126 is connected to the carry out terminal COUT of the serial access memory 101 and the comparator 128. The counter 126 is designed to count the number of the clocks since the address counter 111 is set at an initial value until the carry signal CARRY is supplied therefrom. The value counted by the counter circuit 126 is hereinafter called "actual counted value (An)." The comparator 128 is designed to compare the actual counted value with a reference value "Rn," which is calculated in advance. The reference value "Rn" is obtained by previously calculating the number of clocks to be provided from the initial value of the address counter 111 until the carry is outputted from the counter 111.

Figure 3:
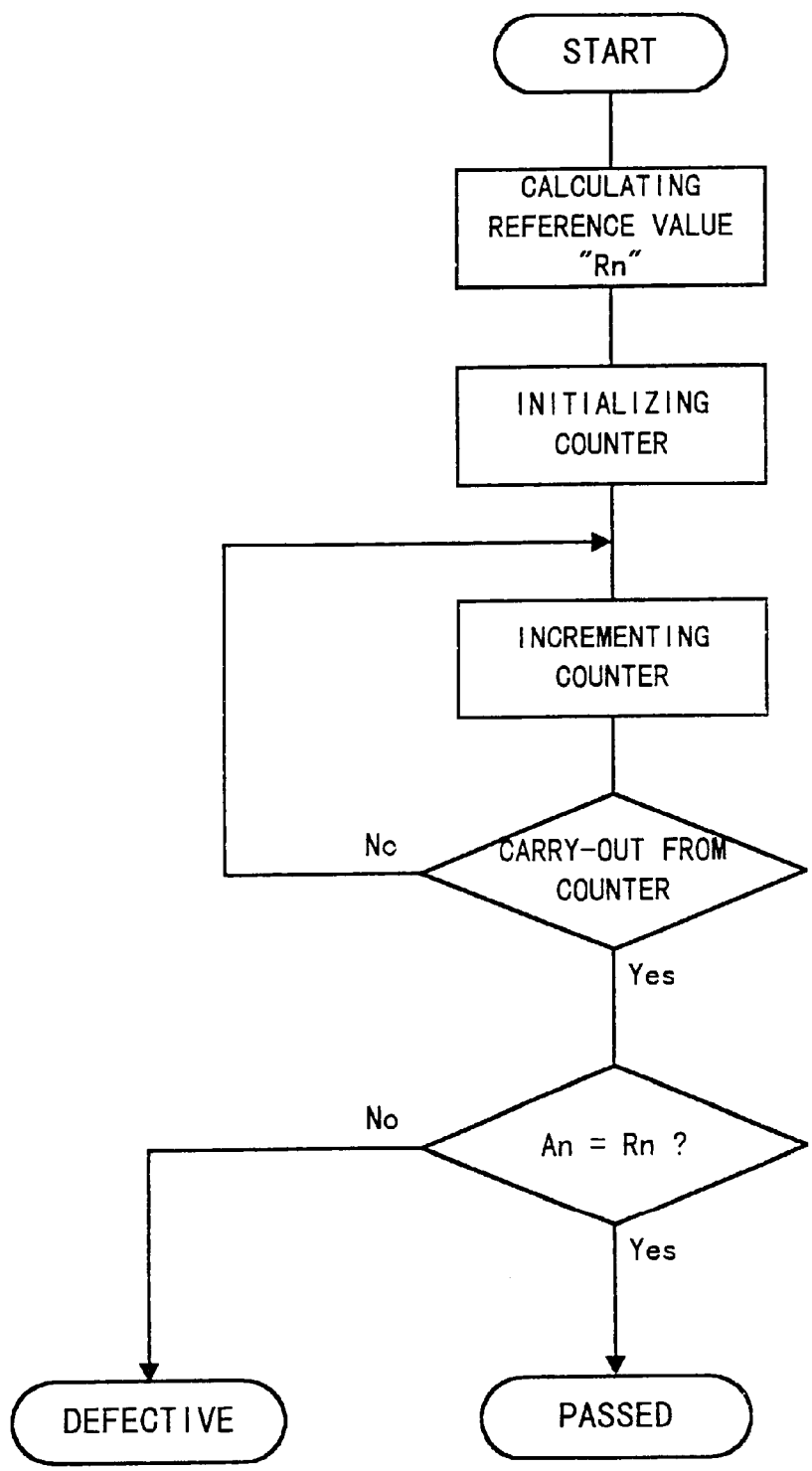
FIG. 3 is a flow chart showing the operation of the first preferred embodiment.
Figure 4:
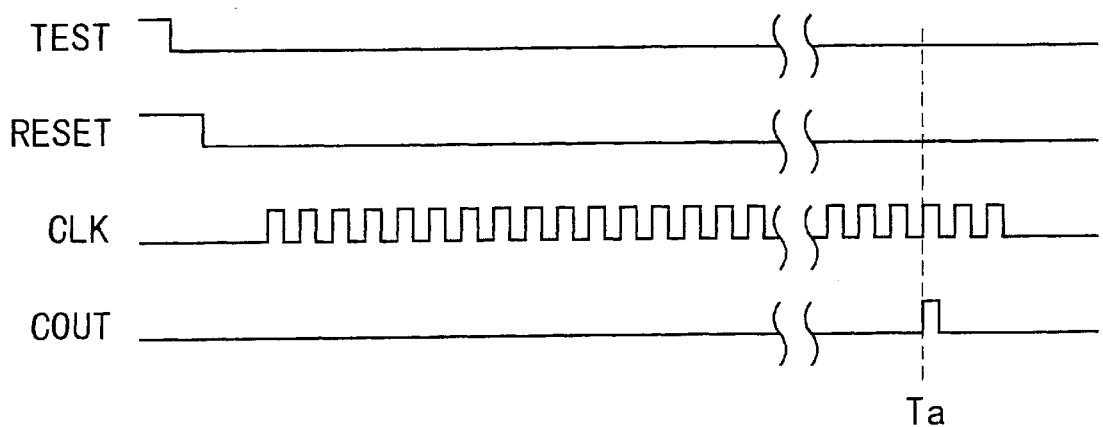
FIG. 4 is a timing chart showing the operation of the first preferred embodiment.

Next, the operation of the address counter 111 is described in conjunction with a flow chart and a timing chart, respectively shown in FIGS. 3 and 4. First, for starting the test of the address counter 111, the test terminal (TEST) is set at low. Next, the reset terminal (RESET) is changed in status high to low to reset the address counter 111 to zero. After that, the memory tester 102 supplies the clocks to the serial access memory 101 to increment the address counter 111 one by one in synchronization with the clocks. As mentioned before, the address counter 111 outputs the carry signal CARRY in response to $1024^{th}$ clock, because the address counter 111 is of 10-bit type. The carry signal CARRY is outputted from the carry out terminal COUT to the counter circuit 126 of the memory tester 102.

In the memory tester 102, the counter circuit 126 counts up the clocks supplied from the clock generator 124 to provide the actual counted value "An," which is obtained by counting the clocks until the carry signal CARRY is outputted from the carry out terminal COUT. The comparator 128 compares the actual counted value "An," supplied from the counter circuit 126, to the reference value "Rn," which is obtained by calculating the number of the clocks since the initial value (zero) is set in the address counter 111 until the carry signal (CARRY) is outputted therefrom. On the basis of the result of the comparison, the memory tester 102 decides whether the address counter 111 is normally operating or not.

If the address counter 111 is normally operating, the actual counted value "An" is identical to the previously-calculated reference value "Rn."

On the other hand, if the address counter 111 is not operating normally, the actual counted value "An" is different from the previously-calculated reference value "Rn." Accordingly, the address counter 111 can be tested easily in a short time without performing a read/write process to the memory array 112.

Figure 5:
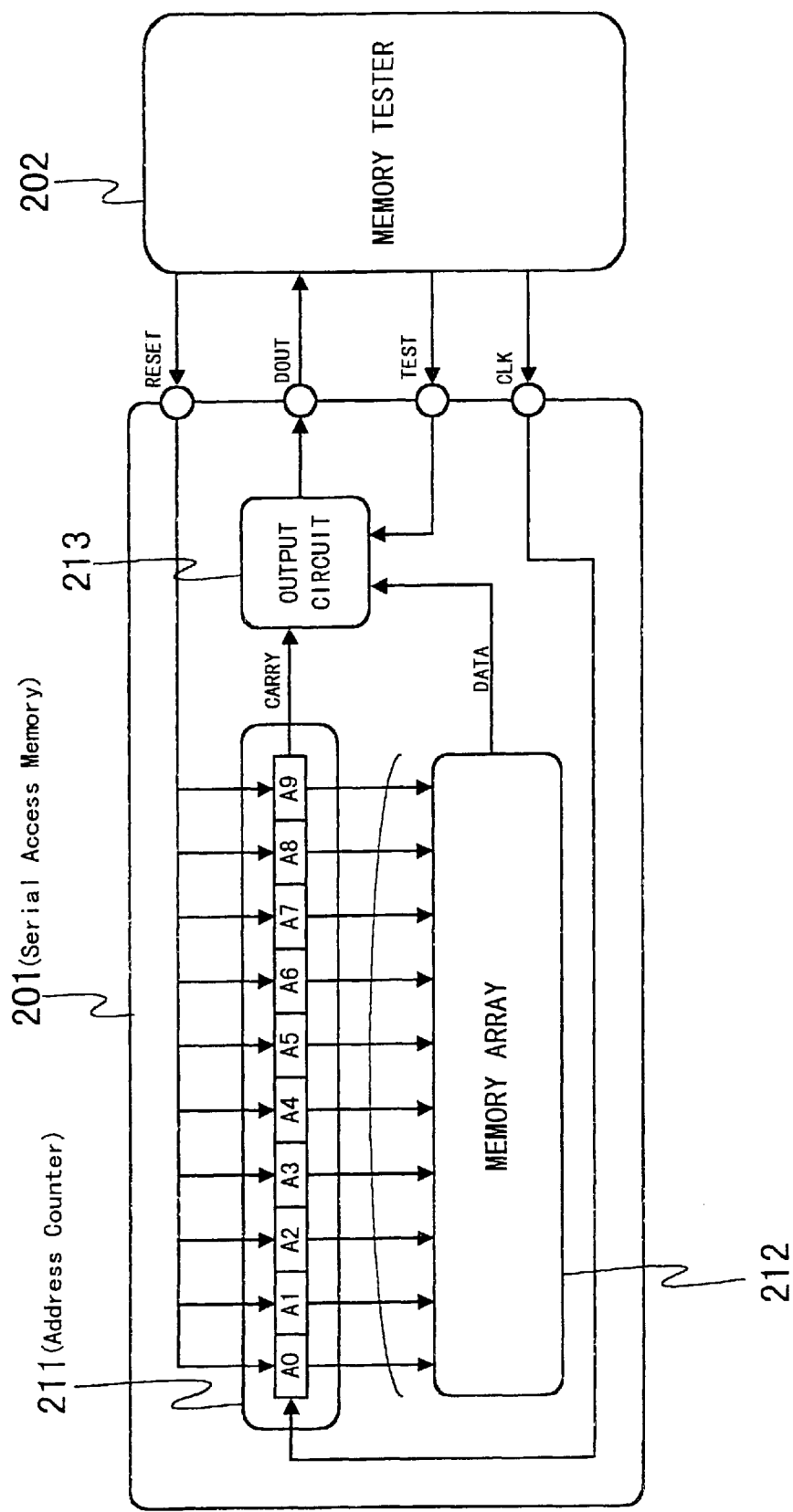
FIG. 5 is a block diagram showing a serial access memory and a memory tester, according to a second preferred embodiment of the invention.

FIG. 5 shows a serial access memory 201 and a memory tester 202, according to a second embodiment of the invention. The serial access memory 201 includes an address counter 211, a memory array 212 and an output circuit 213. The serial access memory 201 further includes a reset terminal RESET, a data out terminal DOUT, a test terminal TEST and a clock terminal CLK. The serial access memory 201 is not provided with a carry out terminal. The reset terminal RESET is connected to the memory tester 202 and the address counter 211. The data out terminal DOUT is connected to the memory tester 202 and the output circuit 213. The test terminal TEST is connected to the memory tester 202 and the output circuit 213. The clock terminal CLK is connected to the memory tester 202 and the address counter 211. The output circuit 213 is connected to the address counter 211 and the memory array 212. The difference between the first and second embodiments is that a carry signal CARRY and data signal DATA, which are to be selected by the output circuit 213, are outputted from the common data out terminal DOUT.

The basic operation of the second preferred embodiment is the same as the first preferred embodiment, shown in FIG. 1. The address counter 211 is reset to zero in response to a reset signal, and is incremented one by one in synchronization with clocks. Then, the actual counted value is compared with the previously-calculated reference value to decide whether the address counter 211 is operating normally or not. For starting a test of the address counter 211, in the second embodiment, a low level signal is supplied from the memory tester 202 to the test terminal TEST of the serial access memory 201 to disable the output circuit 213. In response to the test signal, the output circuit 213 performs switching operation to allow the carry signal CARRY to be outputted from the data out terminal DOUT. In other words, the carry signal CARRY is outputted from the data output terminal DOUT during the test to the memory tester 202.

When the test of the address counter 211 is not performed, the data (DATA) outputted from the memory array 212 are supplied from the data out terminal DOUT to the memory tester 202. In the second embodiment, the carry signal CARRY, which is to be outputted during the test, and the data (DATA), which are to be outputted during not testing, are transmitted through the same terminal DOUT. As a result, the total number of terminals of the serial access memory 201 can be decreased.

Figure 6:
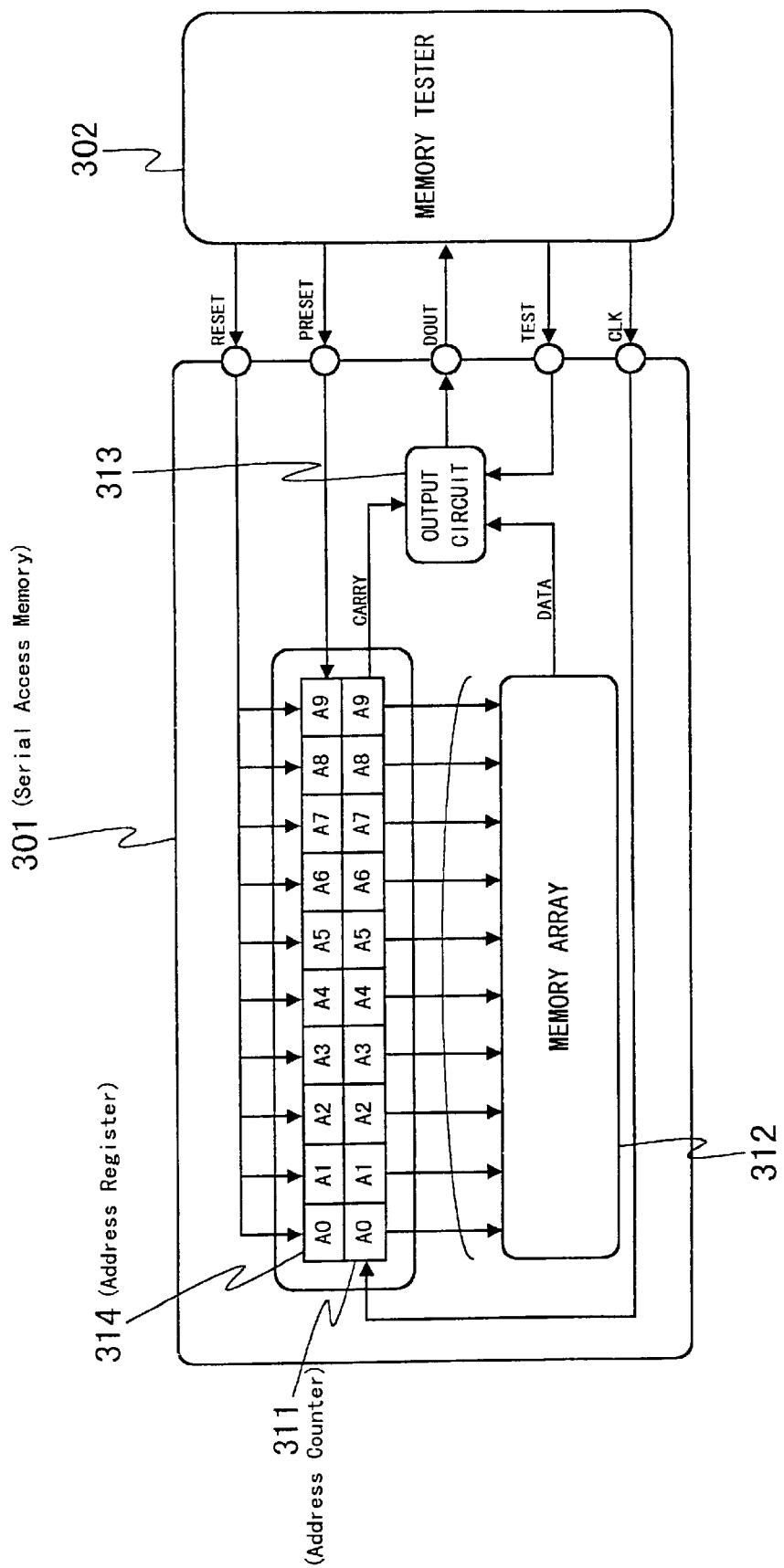
FIG. 6 is a block diagram showing a serial access memory and a memory tester, according to a third preferred embodiment of the invention.

FIG. 6 shows a serial access memory 301 and a memory tester 302, according to a third preferred embodiment of the invention. The serial access memory 301 includes an address counter 311, a memory array 312, an output circuit 313 and an address register 314. The serial access memory 301 further includes a reset terminal RESET, a preset terminal PRESET, a data out terminal DOUT, a test terminal TEST and a clock terminal CLK. The serial access memory 301 is not provided with a carry out terminal. The reset terminal RESET is connected to the memory tester 302 and the address register 314. The preset terminal PRESET is connected to the memory tester 302 and the address register 314. The data out terminal DOUT is connected to the memory tester 302 and the output circuit 313. The test terminal TEST is connected to the memory tester 302 and the output circuit 313. The clock terminal CLK is connected to the memory tester 302 and the address counter 311. The output circuit 313 is connected to the address counter 311 and the memory array 312.

The basic operation of the third preferred embodiment is the same as the first and second preferred embodiments, shown in FIGS. 1 and 5. The address counter 311 (including the address register 314) is reset in response to a reset signal to zero, and is incremented one by one in synchronization with clocks. Then, the actual counted value of clocks, which is counted until the carry signal (CARRY) is outputted, is compared with the previously-calculated reference value to decide whether the address counter 311 is operating normally or not.

In the third embodiment, the address counter 311 can be preset to values other than zero. The memory tester 302 supplies an initial address to the preset terminal PRESET of the serial access memory 301, so that the initial address is held in the address register 314. The address counter 311 is incremented from the initial address, supplied from the address register 314, in synchronization with the clocks (CLK).

For example, the address register 314 is supplied at addresses A9 to A0 with a signal of "1100000000," the address counter 311 is preset at addresses A9 to A0 to "1100000000." The memory tester 302 calculates the number of clocks (256) to be provided from the value of "1100000000" until a carry signal (CARRY) is outputted from the address counter 311. The memory tester 302 compares the previously-calculated reference value to the actual counted value.

If the actual counted value is identical to the previously-calculated reference value, it is decided that the address counter 311 was operating normally for the period of time since the counter was preset until the carry signal (CARRY) was outputted. On the other hand, if the actual counted value is different from the previously-calculated reference value, it is decided that the address counter 311 was not operating normally.

According to the third embodiment, the memory tester 302 is designed to preset the address counter 311 using the address register 314, so that the preset circuit can also be inspected.

As described above, a method for testing a counter and a serial access memory according to the invention provides the following advantages: The counter can be tested easily in a short time without a read/write process to the memory. Further, the source of the detective can be found clearly from the test of the counter, because no reading and no writing process are performed to the memory array.

Although each of the above described embodiments is designed so that the memory counter (111, 211 and 311) is tested in accordance with signals supplied from the memory tester (102, 202 and 302) connected outside the serial access memory (101, 102 and 301), the circuitry of the memory tester (102, 202 and 302) can be contained in the same chip of the serial access memory (101, 201 and 301). In the above described embodiments, the address counter (111, 211 and 311) contained in the serial access memory (101, 201 and 301) is tested, however, the invention is applicable to other kinds of devices that include an address counter, which is to output a carry signal (CARRY). The memory tester (102, 202 and 302) can be realized not only by hardware but also software, for example stored in a ROM.

It will be understood that the above description of the present invention is susceptible to various modifications, changes and adaptations, and the same are intended to be comprehended with the meaning and range of equivalents of the appended claims.

What is claimed is:

1. A serial access memory, which operates in synchronism with clocks, comprising:

a memory array which stores predetermined data;

an address counter which is incremented in response to the clocks and outputs a carry when it is overflowed; and an output circuit which selectively outputs the data supplied from the memory array and the carry supplied from the address counter, wherein the output circuit selects the data when a test of the address counter is not performed and selects the carry when the test of the address counter is performed.

2. The serial access memory, according to claim 1, further comprising:

a carry output terminal connected to the output circuit to output the carry therefrom; and a data output terminal connected to the output circuit to output the data therefrom.

3. The serial access memory, according to claim 2, further comprising:

a test terminal from which a test signal is supplied to the output circuit, the test signal representing the requirement of the test of the address counter, wherein the output circuit selects one from the data and carry in response to the test signal.

4. The serial access memory, according to claim 1, further comprising:

a single output terminal from which the carry and data are selectively outputted.

5. The serial access memory, according to claim 1, further comprising:

an address register which presets the address counter to a desirable initial value.

* * * * *

UNITED STATES PATENT AND TRADEMARK OFFICE
CERTIFICATE OF CORRECTION

PATENT NO. : 5,930,186
DATED : July 27, 1999
INVENTOR(S) : Itsuro IWAKIRI

It is certified that error appears in the above-identified patent and that said Letters Patent is hereby corrected as shown below:

Column 1, line 27, after "data" change "of" to --values--;

Column 1, line 36, after "data" change "of" to --values--;

Column 1, line 37, after "data" delete "of";

Column 1, line 43, after "increasingly" delete "to"; and change "have a large" to --large in--;

Column 1, line 44, after "takes" insert --a--;

Column 1, line 47, change "decide" to --decided--;

Column 1, line 48, change both occurrences "on" to --with--;

Column 2, line 13, change "clocks" to --a clock--;

Column 2, line 15, change first occurrence "clocks" to --cycles of a clock signal--;

Column 2, line 16, change "number of the clocks is" to --clock cycles (or "clocks") are--;

Column 2, line 21, delete "previously" and change "clocks" to --clock cycles--;

Column 2, line 26, delete "is";

Column 2, line 27, change "is overflowed" to --overflows--;

Column 2, line 29, change "counts, in response to the clocks," to --counts--;

Column 2, line 30, change "clocks, the number of the clocks" to --the number of clock cycles--;

UNITED STATES PATENT AND TRADEMARK OFFICE
CERTIFICATE OF CORRECTION

PATENT NO. : 5,930,186
DATED : July 27, 1999
INVENTOR(S) : Itsuro IWAKIRI

It is certified that error appears in the above-identified patent and that said Letters Patent is hereby corrected as shown below:

Column 2, line 31, change first occasion "counter" to --counter,--;

Column 2, line 33, change "value, which is" to --value--;

Column 2, line 38, change "clocks," to --a clock,--;

Column 2, line 41, change "the clocks" to --cycles of the clock signal--; and change "is overflowed" to --overflows--;

Column 2, line 46, before "data" insert --supplied--; and line 46, before "carry" insert --supplied--;

Column 3, line 24, after "and" insert --when performing--;

Column 3, line 25, after "of" insert --a--;

Column 3, line 26, delete "value"; and line 26, change "clocks" to --a clock (or "clock generator")--;

Column 3 line 27, change "supplied from" to --that supplies a clock signal through--;

Column 3 line 28, after "to" insert --the--;

Column 3 line 29, after "clock" insert --cycle--;

Column 3 line 33, change "selects," to --selects--;

Column 3 line 46, after "generator" insert --(clock signal generator)--;

Column 3 line 58, change "since" to --(or clock cycles) from when--;

Column 4, line 6, change "high to low" to --from high to low,--;

Column 4 line 9, change "clocks" to --clock generator 124--;

UNITED STATES PATENT AND TRADEMARK OFFICE
CERTIFICATE OF CORRECTION

PATENT NO. : 5,930,186
DATED : July 27, 1999
INVENTOR(S) : Itsuro IWAKIRI

It is certified that error appears in the above-identified patent and that said Letters Patent is hereby corrected as shown below:

Column 4 line 10, change "before" to --above--;

Column 4 line 12, after "of" insert --the--;

Column 4 line 26, change "normally operating" to --operating normally--;

Column 4 line 59, change "embodiment," to --embodiment--;

Column 4 line 61, change "by one" to --at a time--;

Column 4 line 62, change "clocks" to --the clock generator--.

Column 5, line 11, change "during" to --when--;

Column 5, line 35, change "embodiments shown in Figs" to --embodiments shown in Figs.--;

Column 5, line 37, after "reset" insert --to zero--;

Column 5, line 38, delete "to zero"; and after "with" insert --the--;

Column 5, line 39, change "clocks" to --clock generator--;

Column 5, line 49, change "address," to --address--; and

Column 5, lines 50 and 51, change "clocks (CLK)" to --clock generator--.

Column 6, line 8, change "to" to --on--;

Column 6, line 9, change "to" to --on--.

Column 6, line 18, change "of" to --as--; and

Column 6, line 8, change "tested," to --tested;--.

UNITED STATES PATENT AND TRADEMARK OFFICE
CERTIFICATE OF CORRECTION

PATENT NO. : 5,930,186

DATED : July 27, 1999

INVENTOR(S) : Itsuro IWAKIRI

It is certified that error appears in the above-identified patent and that said Letters Patent is hereby corrected as shown below:

Column 6, line 1, claim 1, change "clocks" to --a clock--;

Column 6, line 36, claim 1, change "the clocks" to --clock cycles--; and after "carry" insert --for providing an address for the memory array,--;

Column 6, line 36, claim 1, after "when" change "it is overflowed" to --the counter overflows--;

Column 6, line 38, claim 1, after "data" insert --when--;

Column 6, line 39, claim 1, after "and" insert --outputs--; and after "carry" insert --when--;

Column 6, line 41, claim 1, before "data" insert --supplied--;

Column 6, line 42, claim 1, before "carry" insert --supplied--;

Column 6, line 52, claim 3, change "from" to --connected to the output circuit, through--; and Column 6, line 60, claim 4, after "terminal" insert --connected to the output circuit--.

Signed and Sealed this

Twenty-fifth Day of April, 2000

Attest:

Q. TODD DICKINSON

*Attesting Officer*    *Director of Patents and Trademarks*